(12) United States Patent
Kobayashi

(10) Patent No.: US 7,157,759 B2
(45) Date of Patent: Jan. 2, 2007

(54) SOLID-STATE IMAGING DEVICE

(75) Inventor: Hirokazu Kobayashi, Saitama (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 11/043,153

(22) Filed: Jan. 27, 2005

(65) Prior Publication Data
US 2005/0161714 A1 Jul. 28, 2005

(30) Foreign Application Priority Data
Jan. 28, 2004 (JP) ............................ P2004-019380

(51) Int. Cl.
*H01L 31/062* (2006.01)
(52) U.S. Cl. ................ 257/294; 257/233; 257/E27.133
(58) Field of Classification Search ........ 257/290–292, 257/294, 229–251, 432–433, E33.076, E27.133, 257/E27.134; 359/619–622, 224
See application file for complete search history.

(56) References Cited

U.S. PATENT DOCUMENTS 6,831,692 B1 * 12/2004 Oda ............................ 348/315

FOREIGN PATENT DOCUMENTS

JP 10-74926 3/1998

* cited by examiner

*Primary Examiner*—Minhloan Tran
*Assistant Examiner*—Benjamin Tzu-Hung Liu
(74) *Attorney, Agent, or Firm*—McGinn IP Law Group PLLC

(57) ABSTRACT

A solid-state imaging device comprises: photoelectric converting regions, wherein each of the photoelectric converting regions includes first photoelectric converting regions and second photoelectric converting regions arranged in row and column directions; and microlenses each of which being formed above and covering each of the first photoelectric converting regions, wherein each of the second photoelectric converting regions is placed between ones of the microlenses covering adjacent ones of the first photoelectric converting regions, a length in a first direction with respect to an opening center of each of the second photoelectric converting regions is longer than a length in a second direction with respect to the same, and among directions of incidence in a plan view of light entering the second photoelectric converting regions, the microlenses blocks the light along the first direction by a highest degree and blocks the light along the second direction by a lowest degree, respectively.

9 Claims, 6 Drawing Sheets

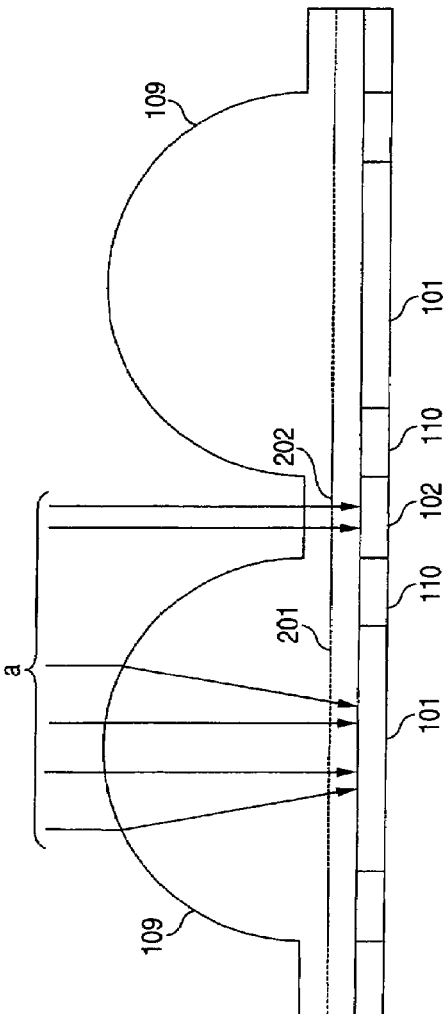
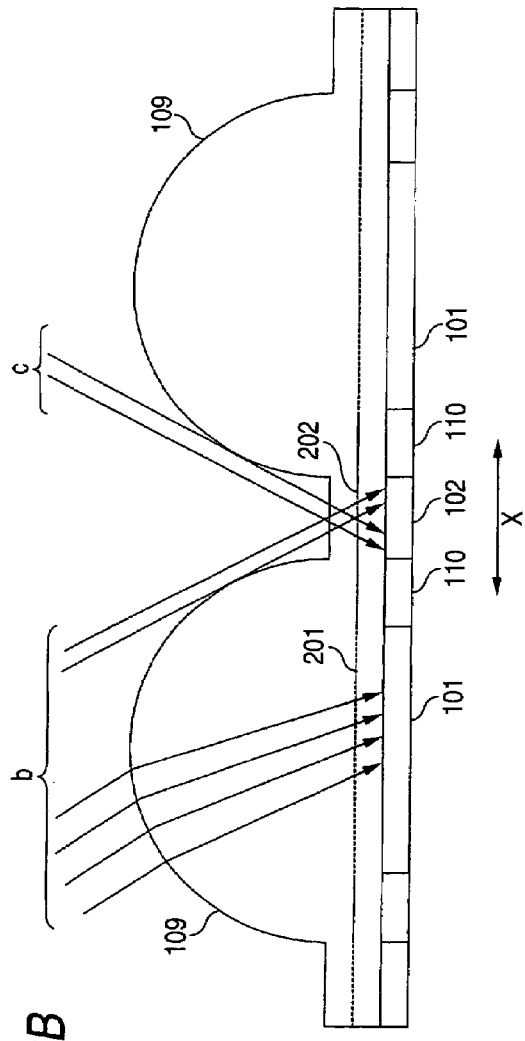
FIG. 3A
FIG. 3B

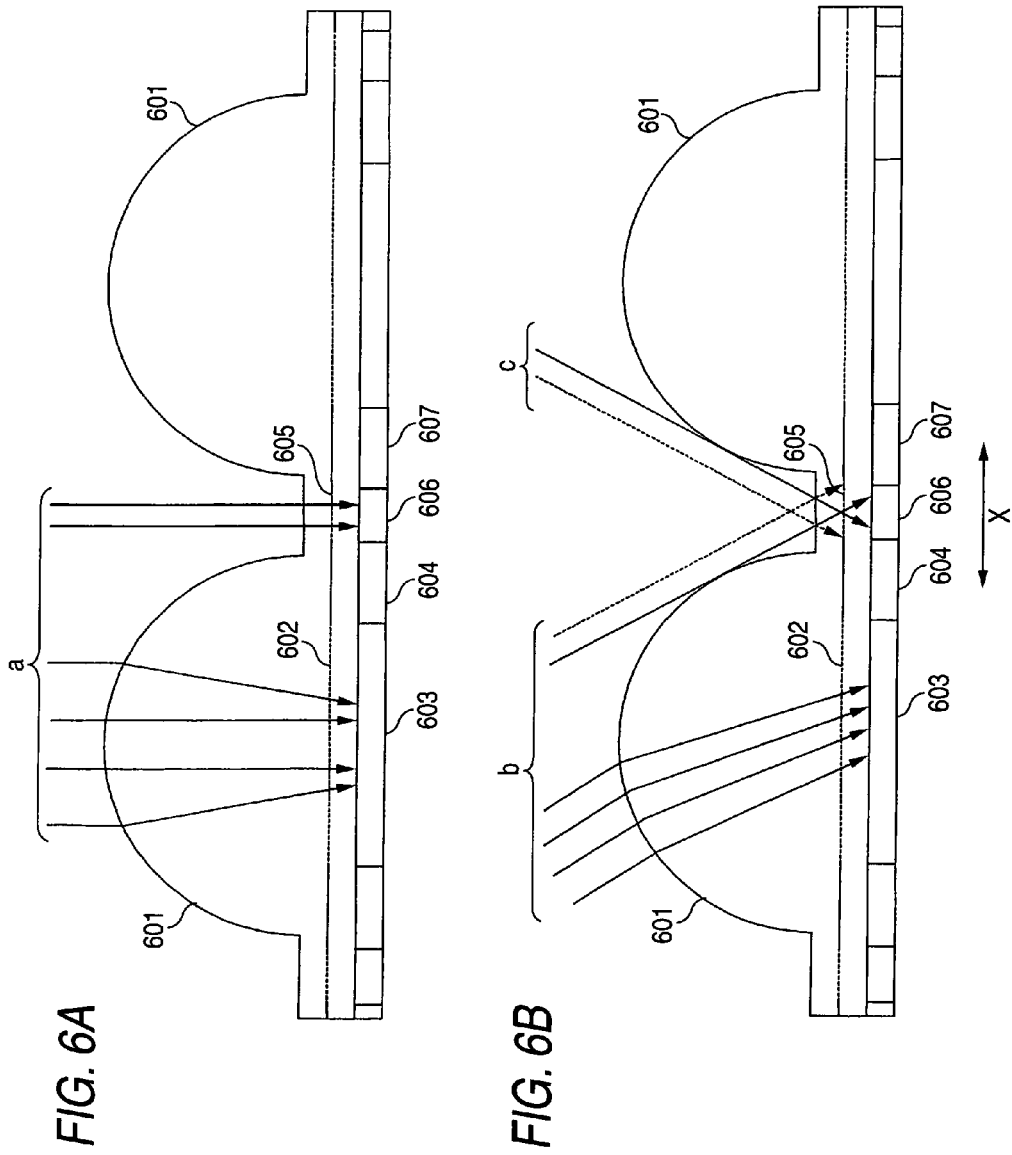

SOLID-STATE IMAGING DEVICE

BACKGROUND OF THE INVENTION

1. Field of the Invention

The present invention relates to a solid-state imaging device including photoelectric converting regions which are arranged on a semiconductor substrate.

2. Description of the Related Art

In the related art, a digital camera is known in which the dynamic range is widened by using a solid-state imaging device having the following configuration (see JP-A-10-74926). The solid-state imaging device includes: first photoelectric converting regions which are arranged on a semiconductor substrate in a row direction and a column direction that is perpendicular to the row direction; and microlenses which are disposed on the first photoelectric converting regions, respectively. Each of second photoelectric converting regions is placed between the microlenses. Image signals from the first photoelectric converting regions and those from the second photoelectric converting regions are combined with each other.

In such a solid-state imaging device, plural photoelectric converting regions are arranged on a semiconductor substrate in a high density, and hence distances between microlenses respectively corresponding to the photoelectric converting regions are very short. In the technique disclosed in JP-A-10-74926, the second photoelectric converting regions are disposed between the microlenses. As described above, the distances between the microlenses are very short. When the second photoelectric converting regions are not provided with an opening of an improved shape, therefore, shading is caused by the microlenses. Hereinafter, the reason of this phenomenon will be described.

FIG. 6 is a view schematically showing a section of the solid-state imaging device disclosed in JP-A-10-74926.

As shown in FIG. 6A, light a which vertically enters from the upper side of the related-art solid-state imaging device is incident on a microlens 601, and then passed through an opening face 602 to be collected on a first photodiode (PD) 603. Charges accumulated in the PD are transferred through a first vertical transfer section 604. Furthermore, light a is passed through an opening face 605 to be incident on a second PD 606 placed between microlenses 601, and charges accumulated in the PD are transferred through a second vertical transfer section 607.

As shown in FIG. 6B, light b which enters from the upper side of the solid-state imaging device obliquely with the arrangement direction of two microlenses 601 that are placed across the second PD 606 is incident on one of the microlenses 601, and then passed through the opening face 602 to be collected on the first PD 603. Charges accumulated in the PD are transferred through the first vertical transfer section 604. Also, light b is passed through the opening face 605 to be incident on the second PD 606. However, part (the arrow indicated by the broken line) of the light b cannot be passed through the opening face 605. Also light c which enters in a direction that is symmetrical to the light b operates in the same manner. By contrast, most of light which enters in a direction (a direction perpendicular to the direction indicated by the arrow X in the figure) along which the second PD 606 is not interposed between the microlenses 601 is incident on the second PD 606 because there is no obstacle such as microlenses.

As described above, in the case where the PD is placed in the narrow region between the two microlenses 601, a large portion of the PD hides behind the microlenses 601 with respect to light b, c which enters obliquely in the direction along which the second PD 606 is interposed between the microlenses 601. Therefore, most of such light cannot be passed through the opening face 605. By contrast, most of light which enters in a direction along which the second PD 606 is not interposed between the microlenses 601 is incident on the second PD 606. In an image obtained from the second PD 606, consequently, brightness in the direction (a direction perpendicular to the direction X) along which the second PD 606 is not interposed between the microlenses 601 is higher, and that in the arrangement direction (the direction X) of the two microlenses 601 between which the second PD 606 is interposed is lower, thereby causing shading. This shading is not shading which is caused in a peripheral portion of the solid-state imaging device of FIG. 6 by an optical system of the digital camera on which the solid-state imaging device is mounted, but special shading which is caused by the microlenses 601.

JP-A-10-74926 teaches nothing about a configuration for reducing such special shading, such as a specific shape of the opening for the second PD 606.

SUMMARY OF THE INVENTION

The invention has been conducted in view of the circumstances discussed above. It is an object of the invention to provide a solid-state imaging device which can suppress occurrence of shading.

According to the invention, there is provided a solid-state imaging device comprising: a semiconductor substrate; a plurality of photoelectric converting regions which are arranged on a semiconductor substrate, wherein each of said plurality of photoelectric converting regions includes (1) a plurality of first photoelectric converting regions which are arranged on the semiconductor substrate in a row direction and a column direction that is perpendicular to the row direction and (2) a plurality of second photoelectric converting regions which are arranged on the semiconductor substrate in the row direction and the column direction, each of said plurality of second photoelectric converting regions comprising an opening; and a plurality of microlenses, each of which being formed above and covering each of the first photoelectric converting regions, wherein each of said plurality of second photoelectric converting regions is placed between ones of the microlenses which cover adjacent ones of the first photoelectric converting regions, respectively, a first length in a first direction with respect to a center of the opening of each of the second photoelectric converting regions is longer than a second length in a second direction with respect to the center of the corresponding opening of each of the second photoelectric converting regions, the first direction is a direction along which, among directions of incidence in a plan view of light that is incident on the second photoelectric converting regions, the light is blocked by a highest degree by the microlenses, and the second direction is a direction along which, among directions of incidence in a plan view of light that is obliquely incident on the second photoelectric converting regions, the light is blocked by a lowest degree by the microlenses.

According to the configuration, the length in the first direction with respect to the center of the opening of the second photoelectric converting region is longer than the length in the second direction with respect to the center of the opening of the second photoelectric converting region. Therefore, the difference between the amount of light which is incident on the second photoelectric converting region in the first direction, and that of light which is incident on the region in the second direction can be reduced. Therefore, it is possible to suppress occurrence of shading.

According to the invention, there is provided the solid-state imaging device, wherein said plurality of photoelectric converting regions are arranged in a square lattice pattern, said plurality of first photoelectric converting regions are arranged in a checkered pattern, and said plurality of second photoelectric converting regions are arranged in a checkered pattern.

According to the invention, there is provided the solid-state imaging device, wherein the opening of each of the second photoelectric converting regions has a hexagonal or octagonal shape.

BRIEF DESCRIPTION OF THE DRAWINGS

FIGS. 3A and 3B are section views of the solid-state imaging device of FIG. 1 taken along the line A—A;

FIGS. 6A and 6B are views schematically showing a section of a solid-state imaging device disclosed in JP-A-10-74926.

DETAILED DESCRIPTION OF THE INVENTION

Figure 1:
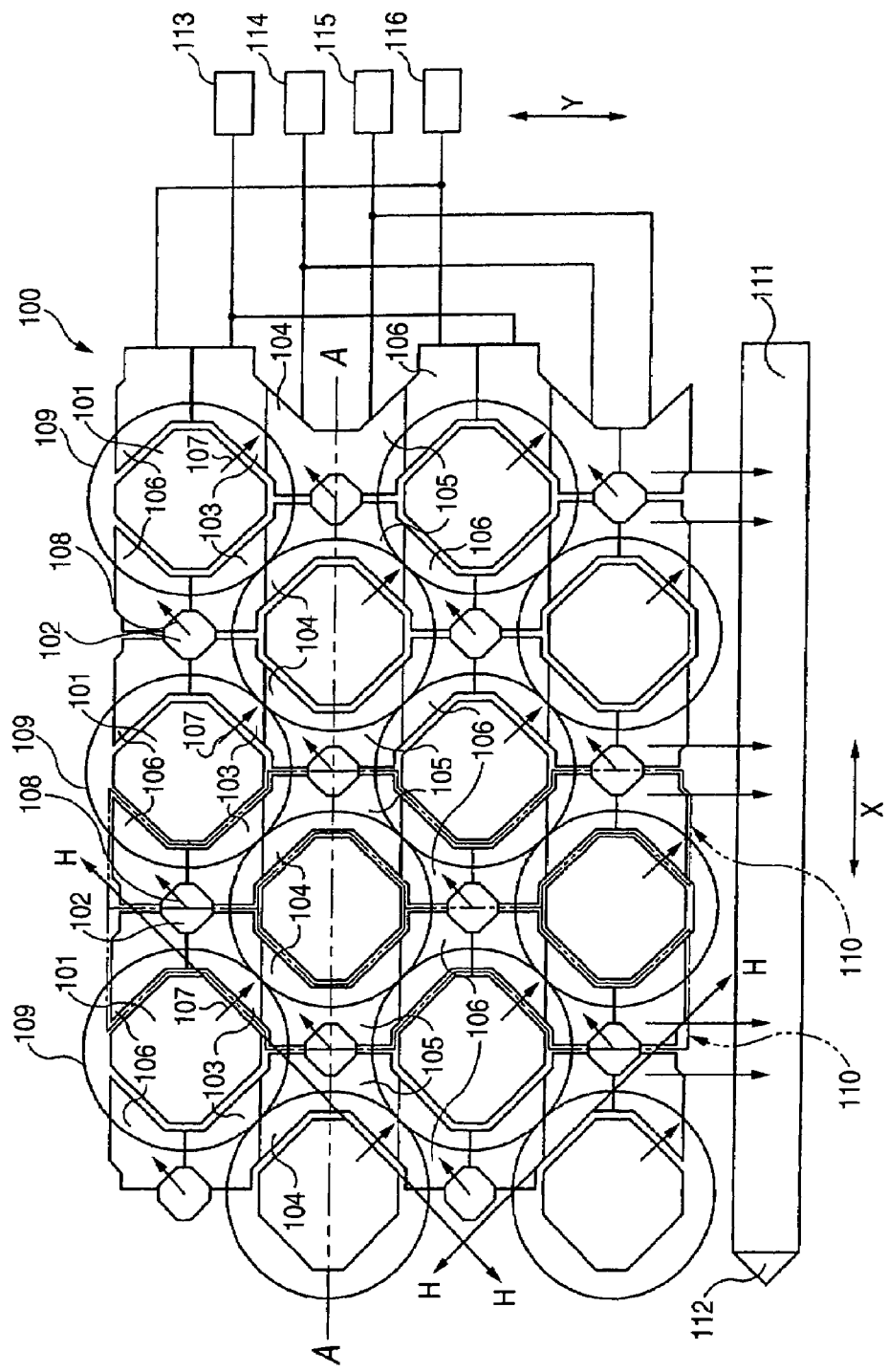
FIG. 1 is a view schematically showing the configuration of a solid-state imaging device illustrating an embodiment of the invention.

FIG. 1 schematically shows the configuration of a solid-state imaging device illustrating an embodiment of the invention.

FIG. 1 is a partial enlarged view of a solid-state imaging device 100.

The solid-state imaging device 100 includes: plural photoelectric converting regions (including plural first photoelectric converting regions 101 and plural second photoelectric converting regions 102 (in FIG. 1, only a part of the regions are designated by the reference numerals)) which are arranged on the surface of a semiconductor substrate in a square lattice pattern or in a row direction (the direction X in FIG. 1) and a column direction (the direction Y in FIG. 1) that is perpendicular to the row direction; plural vertical transfer sections 110 (in FIG. 1, only a part of the sections are designated by the reference numeral) which are disposed correspondingly with respective photoelectric converting region columns each consisting of plural photoelectric converting regions that are arranged in the column direction, and which transfer charges from the photoelectric converting regions in the column direction; a horizontal transfer section 111 which transfers the charges transferred by the vertical transfer sections 110, in the row direction; and an output section 112 which outputs a signal corresponding to the charges transferred by the horizontal transfer section 111. Microlenses 109 (in FIG. 1, only a part of the microlenses are designated by the reference numeral) are formed above the first photoelectric converting regions 101 to cover the regions, respectively. For example, the first and second photoelectric converting regions 101 and 102 are photodiodes. In the first and second photoelectric converting regions 101 and 102 shown in FIG. 1, only portions which can be seen through openings of the regions are illustrated.

The first photoelectric converting regions 101 conduct relatively high-sensitive photoelectric conversion in accordance with the amount of light incident on the solid-state imaging device 100, and are arranged in a checkered pattern. The second photoelectric converting regions 102 conduct relatively low-sensitive photoelectric conversion in accordance with the amount of light incident on the solid-state imaging device 100, and are arranged in a checkered pattern. Each of the second photoelectric converting regions 102 is placed between the microlenses 109 which cover adjacent ones of the first photoelectric converting regions 101, respectively. Each of the first and second photoelectric converting regions 101 and 102 has an octagonal opening. In order to change the sensitivity of each of the first and second photoelectric converting regions 101 and 102, the area (opening area) of the light receiving face of the photoelectric converting region may be changed, or alternatively the light collecting area may be changed by the microlens disposed above the photoelectric converting region. These methods are well known in the art, and hence their description is omitted.

The vertical transfer sections 110 include: plural vertical transfer channels (not shown) which are formed in the column direction on the semiconductor substrate so as to respectively correspond to the photoelectric converting region columns each consisting of photoelectric converting regions arranged in the column direction; plural vertical transfer electrodes 103 to 106 (in FIG. 1, only a part of the electrodes are designated by the reference numeral) which are formed in a layer above the vertical transfer channels; and first and second charge read regions 107 and 108 (in FIG. 1, each of the regions is diagrammatically indicated by an arrow, and only a part of the regions are designated by the reference numerals) which read out charges from the first and second photoelectric converting regions 101 and 102 to the vertical transfer channels. Each of the vertical transfer electrodes 103 to 106 has a meandering shape which elongates in the row direction as a whole between the first and second photoelectric converting regions 101 and 102.

The vertical transfer channels are regions which have a meandering shape, and which elongate as a whole in the column direction between the photoelectric converting region columns. Regions into which charges are to be accumulated and transferred are formed by the vertical transfer electrodes 103 to 106 that are placed above the channels. Sets each consisting of two of the vertical transfer electrodes 103 to 106 are disposed correspondingly with the first and second photoelectric converting regions 101 and 102, respectively. Four-phase vertical transfer pulses (hereinafter, often referred to as drive pulses) are applied to the vertical transfer electrodes 103 to 106 via terminals 113 to 116, so that charges of the vertical transfer channels are transferred in the column direction.

The first charge read regions 107 are disposed in positions corresponding to the vertical transfer electrodes 103 and 105. The second charge read regions 108 are disposed in positions corresponding to the vertical transfer electrodes 104 and 106. Charges are read out from the first photoelectric converting regions 101 to the vertical transfer channels by superimposing a read pulse on the first-phase vertical transfer pulse applied to the terminal 113, and on the third-phase vertical transfer pulse applied to the terminal 115. Charges are read out from the second photoelectric converting regions 102 to the vertical transfer channels by superimposing a read pulse on the second-phase vertical transfer pulse applied to the terminal 114, and on the fourth-phase vertical transfer pulse applied to the terminal 116.

Figure 2:
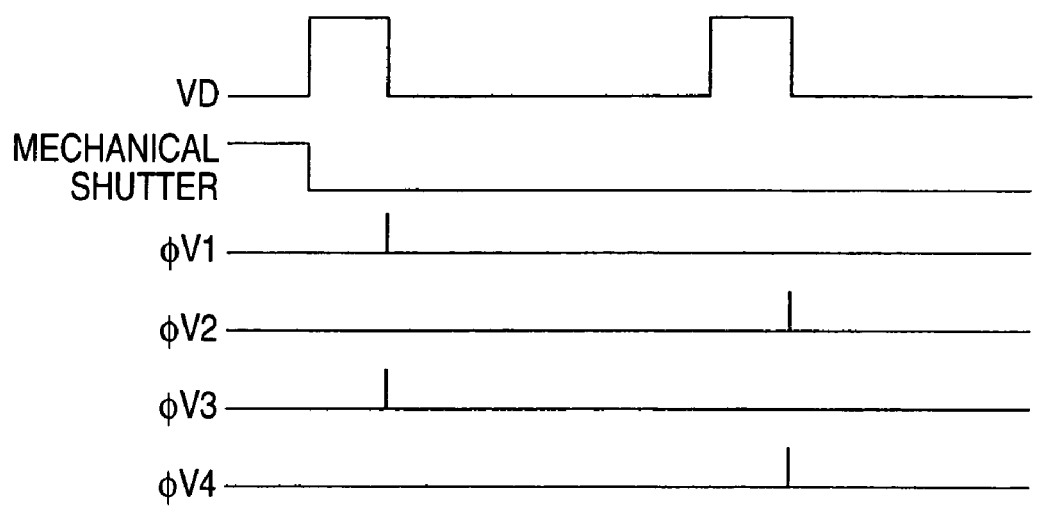
FIG. 2 is a chart showing timings of reading and transferring signal charges.

FIG. 2 is a timing chart illustrating a method of driving the solid-state imaging device 100. FIG. 2 shows timings in the case where a digital camera on which the solid-state imaging device 100 is mounted has a mechanical shutter. In FIG. 2, shown are a vertical synchronizing signal VD, the opening/closing state of the mechanical shutter, the drive pulse φV1 applied to the terminal 113, the drive pulse φV2 applied to the terminal 114, the drive pulse φV3 applied to the terminal 115, and the drive pulse φV4 applied to the terminal 116.

As shown in FIG. 2, during a period when the mechanical shutter is closed, in synchronization with the vertical synchronizing signal VD, the drive pulse φV1 on which the read pulse is superimposed is applied to the terminal 113, and the drive pulse φV3 on which the read pulse is superimposed is applied to the terminal 115. As a result, charges are read out from the first charge read regions 107 to the vertical transfer channels. Furthermore, the drive pulse is repeatedly applied to the terminals 113 to 116 to transfer the read out charges in the column direction. From the horizontal transfer section 111, charges which are read out from the first photoelectric converting regions 101 of one row are transferred at any time to the output portion 112.

In synchronization with the next vertical synchronizing signal VD, the drive pulse φV2 on which the read pulse is superimposed is applied to the terminal 114, and the drive pulse φV4 on which the read pulse is superimposed is applied to the terminal 116. As a result, charges are read out from the second charge read regions 108 to the vertical transfer channels. Furthermore, the drive pulse is repeatedly applied to the terminals 113 to 116 to transfer the read out charges in the column direction. From the horizontal transfer section 111, charges which are read out from the second photoelectric converting regions 102 of one row are transferred at any time to the output portion 112.

In the solid-state imaging device 100, therefore, charges from the first photoelectric converting regions 101, and those from the second photoelectric converting regions 102 can be independently read out.

Next, the opening of each of the second photoelectric converting regions 102 will be described.

Among directions of incidence in a plan view of light that is incident on the second photoelectric converting region 102, a direction along which the light is blocked by the highest degree by the corresponding microlens 109 is set as a first direction, and, among directions of incidence in a plan view of light that is obliquely incident on the second photoelectric converting region 102, a direction along which the light is blocked by the lowest degree by the microlens 109 is set as a second direction. The opening of the second photoelectric converting region 102 satisfies conditions that the length (first length) in the first direction with respect to the center of the opening of the second photoelectric converting region 102 is longer than that (second length) in the second direction with respect to the center of the opening of the second photoelectric converting region 102. The ratio of the first length to the second length is preferably more than 1.0 and less than $\sqrt{2}$.

Referring to FIG. 1, the direction along which light that is incident on the second photoelectric converting region 102 is blocked by the highest degree by the corresponding microlens 109 coincides with the arrangement direction of the two microlenses 109 between which the second photoelectric converting region 102 is interposed, i.e., the directions X and Y in FIG. 1. Since light which is incident on the second photoelectric converting region in the directions X and Y in FIG. 1 is blocked by the highest degree by the microlenses 109, a large amount of the light is not incident on the second photoelectric converting region 102. In the embodiment, therefore, the lengths in the directions X and Y are increased, so that the amount of incident light in the directions X and Y is relatively enlarged.

The direction along which the light that is incident on the second photoelectric converting region 102 in an oblique direction (a direction which is inclined with respect to the direction perpendicular to the semiconductor substrate) is blocked by the lowest degree by the corresponding microlens 109 coincides with a direction along which the second photoelectric converting region is not interposed between the microlenses 109, i.e., the directions H in FIG. 1. Light which is to be incident on the second photoelectric converting region 102 in the directions H is passed through valleys between the microlenses 109 that are arranged in the directions H. Consequently, the light is blocked by the lowest degree by the microlenses 109, and large part of the light is incident on the second photoelectric converting region 102. In the embodiment, therefore, the lengths in the directions H are shortened so that the amount of incident light in the directions H is relatively reduced.

Hereinafter, the manner of light incident on the solid-state imaging device 100 will be described with reference to FIGS. 3A and 3B.

FIGS. 3A and 3B are section views of the solid-state imaging device of FIG. 1 taken along the line A—A.

As shown in FIG. 3A, light a which vertically enters from the upper side of the solid-state imaging device 100 is incident on the microlens 109, and then passed through an opening 201 of the first photoelectric converting region 101 to be collected on the first photoelectric converting region 101. Charges accumulated in the region are transferred through the vertical transfer section 110. Also, light a is passed through an opening 202 of the second photoelectric converting region 102 to be incident on the second photoelectric converting region 102 placed between the two microlenses 109, and charges accumulated in the region are transferred through the vertical transfer section 110.

As shown in FIG. 3B, light b which obliquely enters from the upper side of the solid-state imaging device 100 in the direction X is incident on the microlens 109, and then passed through the opening 201 to be collected on the first photoelectric converting region 101. Charges accumulated in the region are transferred through the vertical transfer section 110. Although the amount light b which is to be incident on the second photoelectric converting region 102 is reduced because the light is blocked by the microlens 109, large part of the light is incident on the second photoelectric converting regions 102 because the length in the direction X with respect to the center of the opening of the second photoelectric converting region 102 is longer than the lengths in the directions H. In light which obliquely enters from the upper side of the solid-state imaging device 100 in the direction Y, large part of light which is to be incident on the second photoelectric converting region is similarly incident on the second photoelectric converting region 102.

In light which obliquely enters from the upper side of the solid-state imaging device 100 in the directions H, light which is to be incident on the second photoelectric converting region 102 is hardly blocked by the microlens 109. Therefore, an excessive amount of light enters the second photoelectric converting region 102. In the embodiment, however, light in the directions H is not excessively incident on the second photoelectric converting region 102 because the lengths in the directions H with respect to the center of the opening of the second photoelectric converting region 102 is shorter than those in the directions X and Y.

Next, a case where the opening of the second photoelectric converting region 102 satisfies the above-mentioned conditions, and that where the opening does not satisfy the conditions will be compared with each other.

Figure 4:
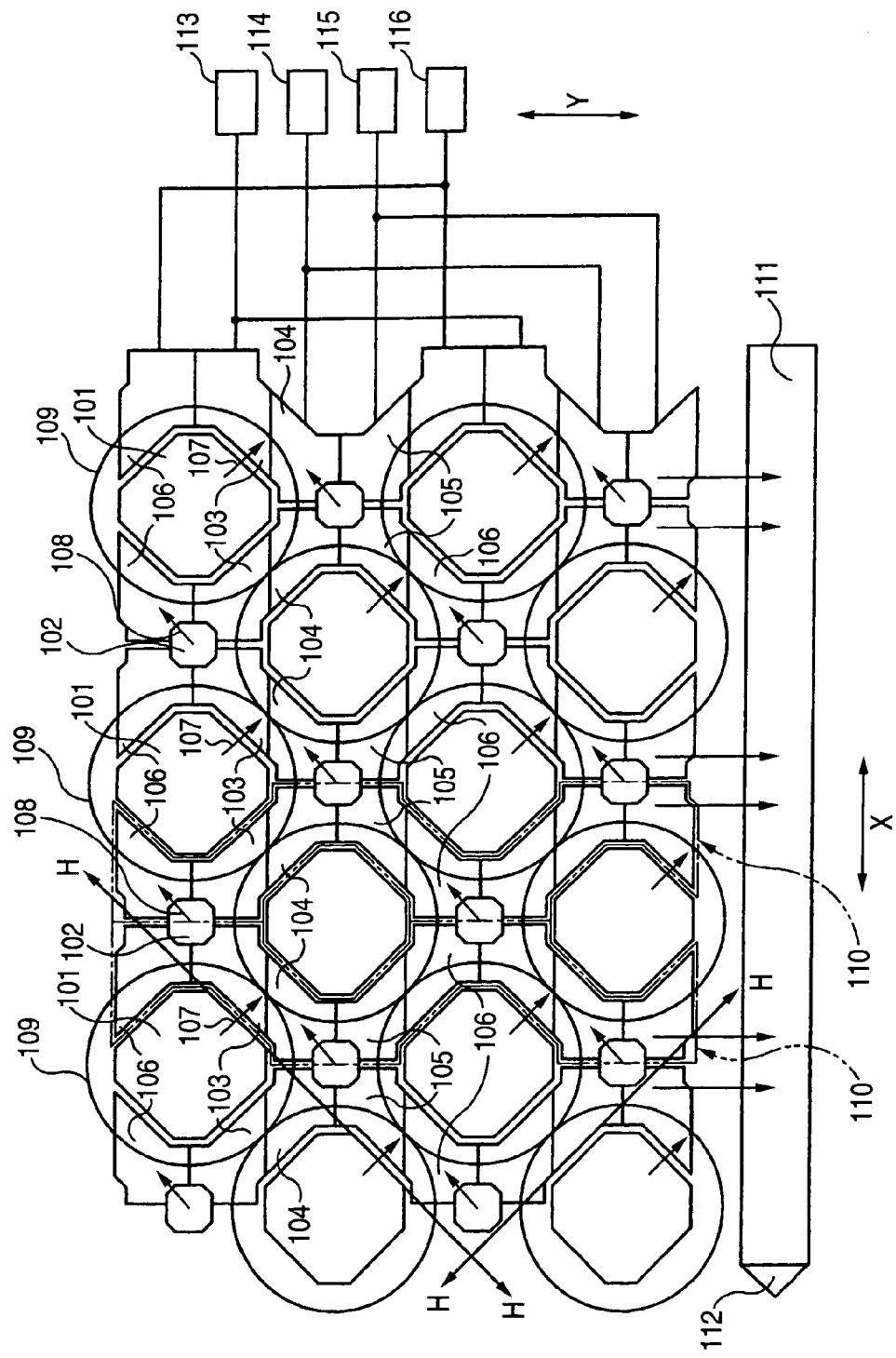
FIG. 4 is a view schematically showing the configuration of a solid-state imaging device in the case where an opening of a second photoelectric converting region does not satisfy conditions.

FIG. 4 is a view schematically showing the configuration of a solid-state imaging device in the case where the opening of the second photoelectric converting region 102 does not satisfy the conditions. The components identical in configuration with those of FIG. 1 are denoted by the same reference numerals.

The opening of the second photoelectric converting region 102 of a solid-state imaging device 400 of FIG. 4 is identical with that shown in FIG. 1, but has a state which is obtained by rotating the opening of the second photoelectric converting region 102 of FIG. 1 by 45 degrees. Therefore, the above-mentioned conditions are not satisfied. In this case, large part of light which vertically enters from the upper side of the related-art solid-state imaging device 400 is incident on the first and second photoelectric converting regions 101 and 102.

In light which obliquely enters from the upper side of the solid-state imaging device 400 in the direction X, the amount of light incident on the second photoelectric converting region 102 is smaller than that in the case of FIG. 1. This is applicable also to light which obliquely enters from the upper side of the solid-state imaging device 400 in the direction Y. By contrast, with respect to light which obliquely enters the solid-state imaging device 400 in the directions H, the range where the light is blocked by the microlens 109 is small. Furthermore, the lengths of the second photoelectric converting region 102 in the directions H are longer. Therefore, the light of an amount which is larger than that in the case of FIG. 1 is incident on the second photoelectric converting region 102.

In the configuration of FIG. 4, as described above, light in the directions H is incident on the second photoelectric converting region 102 at an amount which is larger than that of light in the directions X and Y, and hence brightness in the directions H is excessively high. As a result, the difference in brightness between the directions X and Y, and the directions H is large.

Figure 5A:
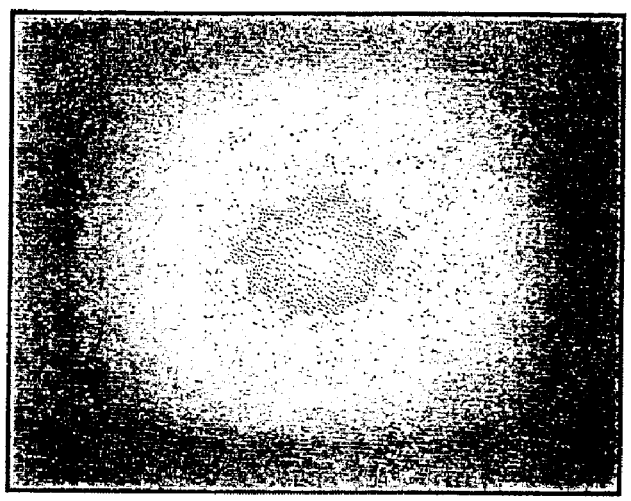
FIG. 5 is a view for comparing images obtained from second photoelectric converting regions with each other.
Figure 5B:
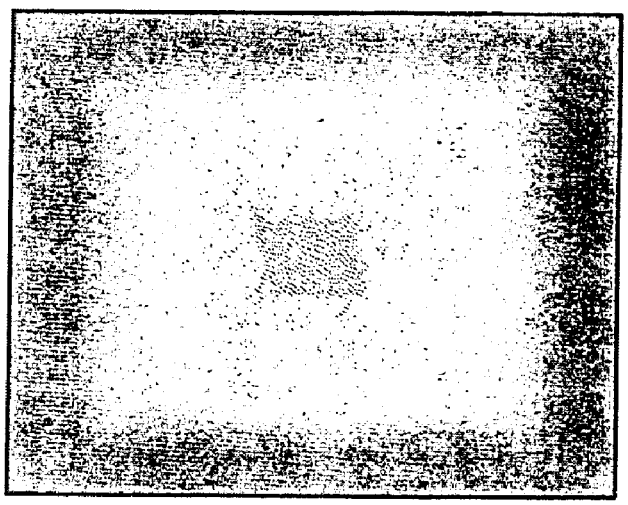

FIG. 5A is a view showing an image based on image data which are obtained from the second photoelectric converting regions 102 of the solid-state imaging device 100 shown in FIG. 1, and FIG. 5B is a view showing an image based on image data which are obtained from the second photoelectric converting regions 102 of the solid-state imaging device 400 shown in FIG. 4.

As shown in FIG. 5B, in the image based on image data which are obtained from the second photoelectric converting regions 102 of the solid-state imaging device 400, a peripheral portion of the image is made dark by shading caused by an optical system of the digital camera on which the solid-state imaging device 400 is mounted. Furthermore, light in the directions H is incident on the second photoelectric converting regions 102 at an amount which is larger than that of incident light in the directions X and Y. Therefore, a bright area which extends in the directions H to have an X-like shape is formed in the image. This is special shading which is caused by the microlenses 109. In the solid-state imaging device 400, as a result of the occurrence of the two kinds of shading, an image which is not well balanced as a whole (an image in which an X-like bright area is formed) is obtained.

As shown in FIG. 5A, in the image based on image data which are obtained from the second photoelectric converting regions 102 of the solid-state imaging device 100, a peripheral portion of the image is made dark by shading caused by an optical system of the digital camera on which the solid-state imaging device 100 is mounted. Incident light in the directions X and Y is well balanced in amount with that in the directions H. Therefore, the difference in brightness between the directions X and Y, and the directions H is so small that a bright area which extends in the directions H to have an X-like shape is not formed in the image, and special shading is not caused. As a result, the image is well balanced as a whole.

According to the solid-state imaging device 100 of FIG. 1, therefore, occurrence of the special shading can be suppressed as compared with the case of the solid-state imaging device 400 of FIG. 4, and a satisfactory image can be obtained from the second photoelectric converting regions 102.

As described above, the solid-state imaging device of the embodiment is a solid-state imaging device which includes the first photoelectric converting regions 101 and the second photoelectric converting regions 102, and in which the second photoelectric converting regions 102 are placed between adjacent ones of the microlenses 109 that are formed above the first photoelectric converting regions 101, respectively. In the solid-state imaging device, when the openings of the second photoelectric converting regions 102 are formed so as to satisfy the above-mentioned conditions, it is possible to suppress occurrence of the special shading.

In the above, the embodiment in which the first photoelectric converting regions 101 and the second photoelectric converting regions 102 are arranged in a checkered pattern has been described. Alternatively, the photoelectric converting regions 101 may be arranged in a square lattice pattern, and each of the second photoelectric converting regions 102 may be placed between microlenses which are above adjacent ones of the first photoelectric converting regions 101. Also in this configuration, when the openings of the second photoelectric converting regions 102 are improved so as to satisfy the conditions, it is possible to suppress occurrence of shading.

The second photoelectric converting regions 102 are not restricted to have an octagonal shape. Also in the case where the second photoelectric converting regions have another polygonal shape such as a square shape or a hexagonal shape, an oval shape, or another shape, it is possible to attain the above-mentioned effect.

According to the invention, it is possible to provide a solid-state imaging device which can suppress occurrence of shading.

The entire disclosure of each and every foreign patent application from which the benefit of foreign priority has been claimed in the present application is incorporated herein by reference, as if fully set forth.

What is claimed is:

1. A solid-state imaging device comprising:
   a semiconductor substrate;
   a plurality of photoelectric converting regions which are arranged on the semiconductor substrate, wherein each of said plurality of photoelectric converting regions includes (1) a plurality of first photoelectric converting regions which are arranged on the semiconductor substrate in a row direction and a column direction that is perpendicular to the row direction and (2) a plurality of second photoelectric converting regions which are arranged on the semiconductor substrate in the row direction and the column direction, each of said plurality of second photoelectric converting regions comprising an opening; and a plurality of microlenses, each of which being formed above and covering each of the first photoelectric converting regions, wherein each of said plurality of second photoelectric converting regions is placed between ones of the microlenses which cover adjacent ones of the first photoelectric converting regions, respectively, a first length in a first direction with respect to a distance from a center of the opening to an edge of the opening of each of the second photoelectric converting regions is longer than a second length in a second direction with respect to the distance from the center of the corresponding opening to the edge of the corresponding opening of each of the second photoelectric converting regions, the first direction is a direction along which, among directions of incidence in a plan view of light that is incident on the second photoelectric converting regions, the light is blocked by a highest degree by the microlenses, and the second direction is a direction along which, among directions of incidence in a plan view of light that is obliquely incident on the second photoelectric converting regions, the light is blocked by a lowest degree by the microlenses.

2. A solid-state imaging device according to claim 1, wherein said plurality of photoelectric converting regions are arranged in a square lattice pattern, said plurality of first photoelectric converting regions are arranged in a checkered pattern, and said plurality of second photoelectric converting regions are arranged in a checkered pattern.

3. A solid-state imaging device according to claim 1, wherein the opening of each of the second photoelectric converting regions includes one of a hexagonal and an octagonal shape.

4. A solid-state imaging device according to claim 1, wherein a ratio of the first length to the second length is more than 1.0 and less than $\sqrt{2}$.

5. A solid-state imaging device according to claim 1, wherein a ratio of the first length of the opening of each of the second photoelectric converting regions to the second length of the opening of each of the second photoelectric converting regions is at least one of greater than 1.0 and less than $\sqrt{2}$.

6. A solid-state imaging device comprising:

an arrangement of photoelectric convening regions on a semiconductor substrate, wherein the photoelectric converting regions include:

a plurality of first photoelectric converting regions, each of which being covered by a microlens; and a plurality of second photoelectric converting regions, wherein each of said second photoelectric converting regions includes an opening, wherein a first length in a first direction with respect to a distance from a center of the opening to an edge of the opening of each of the second photoelectric converting regions is longer than a second length in a second direction with respect to the distance from the center of the corresponding opening to the edge of the corresponding opening of each of the second photoelectric converting regions, wherein the first direction includes a direction along which, among directions of incidence in a plan view of light that is incident on the second photoelectric converting regions, the light is blocked by a highest degree by the microlenses, and wherein the second direction includes a direction along which, among directions of incidence in a plan view of light that is obliquely incident on the second photoelectric converting regions, the light is blocked by a lowest degree by the microlenses.

7. A solid-state imaging device according to claim 6, wherein a ratio of the first length of the opening of each of the second photoelectric converting regions to the second length of the opening of each of the second photoelectric converting regions is at least one of greater than 1.0 and less than $\sqrt{2}$.

8. A method of forming a solid-state imaging device, the method comprising:

forming an arrangement of first and second photoelectric converting regions on a semiconductor substrate; and covering each of said first photoelectric converting regions by a microlens, wherein each of said second photoelectric converting regions includes an opening, and wherein a first length in a first direction with respect to a distance from a center of the opening to an edge of the opening of each of the second photoelectric converting regions is formed longer than a second length in a second direction with respect to the distance from the center of the corresponding opening to the edge of the corresponding opening of each of the second photoelectric converting regions, wherein the first direction includes a direction along which, among directions of incidence in a plan view of light that is incident on the second photoelectric converting regions, the light is blocked by a highest degree by the microlenses, and wherein the second direction includes a direction along which, among directions of incidence in a plan view of light that is obliquely incident on the second photoelectric converting regions, the light is blocked by a lowest degree by the microlenses.

9. A method according to claim 8, wherein a ratio of the first length of the opening of each of the second photoelectric converting regions to the second length of the opening of each of the second photoelectric converting regions is at least one of greater than 1.0 and less than $\sqrt{2}$.

* * * * *